United States Patent
Sano et al.

(10) Patent No.: US 12,096,598 B2
(45) Date of Patent: Sep. 17, 2024

(54) ELECTRONIC APPARATUS

(71) Applicant: LENOVO (SINGAPORE) PTE. LTD., Singapore (SG)

(72) Inventors: Kengo Sano, Yokohama (JP); Masahiro Kitamura, Yokohama (JP); Junki Hashiba, Yokohama (JP); Shusaku Tomizawa, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 201 days.

(21) Appl. No.: 17/935,088

(22) Filed: Sep. 24, 2022

(65) Prior Publication Data

US 2023/0200013 A1    Jun. 22, 2023

(30) Foreign Application Priority Data

Dec. 21, 2021    (JP) ................................. 2021-207025

(51) Int. Cl.
     *H05K 7/20*         (2006.01)
     *G06F 1/20*         (2006.01)

(52) U.S. Cl.
     CPC ......... *H05K 7/20336* (2013.01); *G06F 1/203* (2013.01); *H05K 7/20154* (2013.01); *H05K 7/20172* (2013.01); *H05K 7/20409* (2013.01)

(58) Field of Classification Search
None
See application file for complete search history.

(56) References Cited

U.S. PATENT DOCUMENTS

| | | | |
|---|---|---|---|
| 7,551,442 B2 * | 6/2009 | Stefanoski | H01L 23/467 361/699 |
| 10,856,441 B1 * | 12/2020 | Huang | H05K 7/20727 |
| 11,350,517 B2 * | 5/2022 | Yahara | H05K 7/2089 |
| 2017/0156240 A1 * | 6/2017 | Silvennoinen | H05K 7/20936 |
| 2023/0069684 A1 * | 3/2023 | Kitamura | H05K 7/2039 |

FOREIGN PATENT DOCUMENTS

| | | |
|---|---|---|
| JP | 2008130037 A | 6/2008 |
| JP | 2012141082 A | 7/2012 |
| JP | 2019032134 A | 2/2019 |
| JP | 2020042588 A | 3/2020 |
| WO | 2018003958 A1 | 1/2018 |
| WO | 2019151291 A1 | 8/2019 |

* cited by examiner

*Primary Examiner* — Courtney L Smith
(74) *Attorney, Agent, or Firm* — SHIMOKAJI IP (57) ABSTRACT

An electronic apparatus includes: a chassis; a first and a second heat generating elements which are placed with a step between surfaces thereof; and a cooling module that absorbs heat generated by the first and the second heat generating elements. The cooling module has: a first heat pipe having a first surface thereof connected to a surface of the first heat generating element; a plate-shaped vapor chamber having a first surface thereof connected to a surface of the second heat generating element and a second surface of the first heat pipe; a second heat pipe which is connected to a second surface of the vapor chamber and overlaps the second heat generating element; a first fin connected to the first heat pipe; and a second fin connected to the second heat pipe.

4 Claims, 6 Drawing Sheets

ELECTRONIC APPARATUS

BACKGROUND OF THE INVENTION

Field of the Invention

The present invention relates to an electronic apparatus including a cooling module.

Description of the Related Art

An electronic apparatus such as a laptop PC is equipped with a heat generating element such as a CPU. Such an electronic apparatus includes a cooling module that absorbs the heat generated by a heat generating element and dissipates the heat to the outside. Japanese Unexamined Patent Application Publication No. 2020-42588 discloses a configuration of an electronic apparatus that has a CPU and a GPU as heat generating elements, in which heat pipes are connected to the CPU and the GPU. Further, Japanese Unexamined Patent Application Publication No. 2019-32134 discloses a configuration in which a plate-shaped vapor chamber is connected to a CPU.

SUMMARY OF THE INVENTION

There are cases where the CPU and the GPU described above are placed with a step between the surfaces thereof. In this case, a cooling module needs to be capable of accommodating the step.

On the other hand, in some cases, a CPU in particular performs a turbo operation maintaining a high output state. This means that a cooling module is required to efficiently cool a CPU and a GPU and also to ensure high thermal efficiency that enables the chip of one of the CPU and the GPU to perform the turbo operation.

A major object of the present invention is to provide an electronic apparatus capable of efficiently cooling two heat generating elements having a step therebetween. Further, another object of the present invention is to provide an electronic apparatus capable of performing efficient cooling even if one of two heat generating elements is driven under high load.

An electronic apparatus according to a first aspect of the present invention includes: a chassis; a first and a second heat generating elements which are provided in the chassis and placed with a step between the surfaces thereof; and a cooling module which is provided in the chassis and absorbs heat generated by the first and the second heat generating elements, wherein the cooling module has: a first heat pipe having a first surface thereof connected to a surface of the first heat generating element; a plate-shaped vapor chamber having a first surface thereof connected to a surface of the second heat generating element and a second surface of the first heat pipe; a second heat pipe which is connected to a second surface of the vapor chamber and overlaps the second heat generating element; a first fin connected to the first heat pipe; and a second fin connected to the second heat pipe.

According to the above-described configuration, the first heat pipe is provided between the vapor chamber and the first heat generating element by using the step between the first and the second heat generating elements. Consequently, the electronic apparatus can efficiently cool the two heat generating elements by the two heat pipes and the fins connected thereto, and the vapor chamber stacked between the two heat pipes. In addition, the electronic apparatus can absorb the heat of the first heating element more quickly due to the highly efficient heat-absorbing action of the first heat pipe, thus making it possible to extend the turbo operation time of the first heat generating element.

An electronic apparatus according to a second aspect of the present invention includes: a chassis; a first and a second heat generating elements which are provided in the chassis and placed with a step between surfaces thereof; and a cooling module which is provided in the chassis and absorbs heat generated by the first and the second heat generating elements, wherein the cooling module has: a heat pipe stacked on a surface of the first heat generating element; a heat receiving plate stacked on a surface of the second heat generating element; and a plate-shaped vapor chamber stacked on a surface of the heat-receiving plate and a surface of the heat pipe.

According to the above-described configuration, the heat pipe is provided between the vapor chamber and the first heat generating element by using the step between the first and the second heat generating elements. This enables the electronic apparatus to quickly absorb the heat of the first heat generating element by the highly efficient heat-absorbing action of the heat pipe, thus making it possible to extend the turbo operation time of the first heat generating element.

An electronic apparatus according to a third aspect of the present invention includes: a chassis; a first and a second heat generating elements provided in the chassis; and a cooling module which is provided in the chassis and absorbs heat generated by the first and the second heat generating elements, wherein the cooling module includes: a first heat pipe stacked on a surface of the first heat generating element; a plate-shaped vapor chamber stacked on a surface of the second heat generating element and a surface of the first heat pipe; and a second heat pipe which is stacked on a surface of the vapor chamber and overlaps the first and the second heat generating elements.

According to the above-described configuration, the first heat pipe is provided between the vapor chamber and the first heat generating element, and the second heat pipe overlaps the two heat generating elements. This enables the electronic apparatus to efficiently cool the two heat generating elements. In particular, the electronic apparatus can more quickly absorb the heat of the first heat generating element due to the highly efficient heat-absorbing action of the first heat pipe, thus making it possible to extend the turbo operation time. Further, in the case where load on the second heat generating element is larger than load on the first heat generating element, the electronic apparatus can transport the heat of the second heat generating element by distributing the heat to the two heat pipes through the vapor chamber.

According to an aspect of the present invention, two heat generating elements having a step therebetween can be efficiently cooled. Further, according to another aspect of the present invention, an electronic apparatus capable of performing efficient cooling even when one of two heat generating elements is driven under high load is provided.

DETAILED DESCRIPTION OF THE INVENTION

The following will describe in detail a preferred embodiment of an electronic apparatus in accordance with the present invention with reference to the accompanying drawings.

Figure 1:
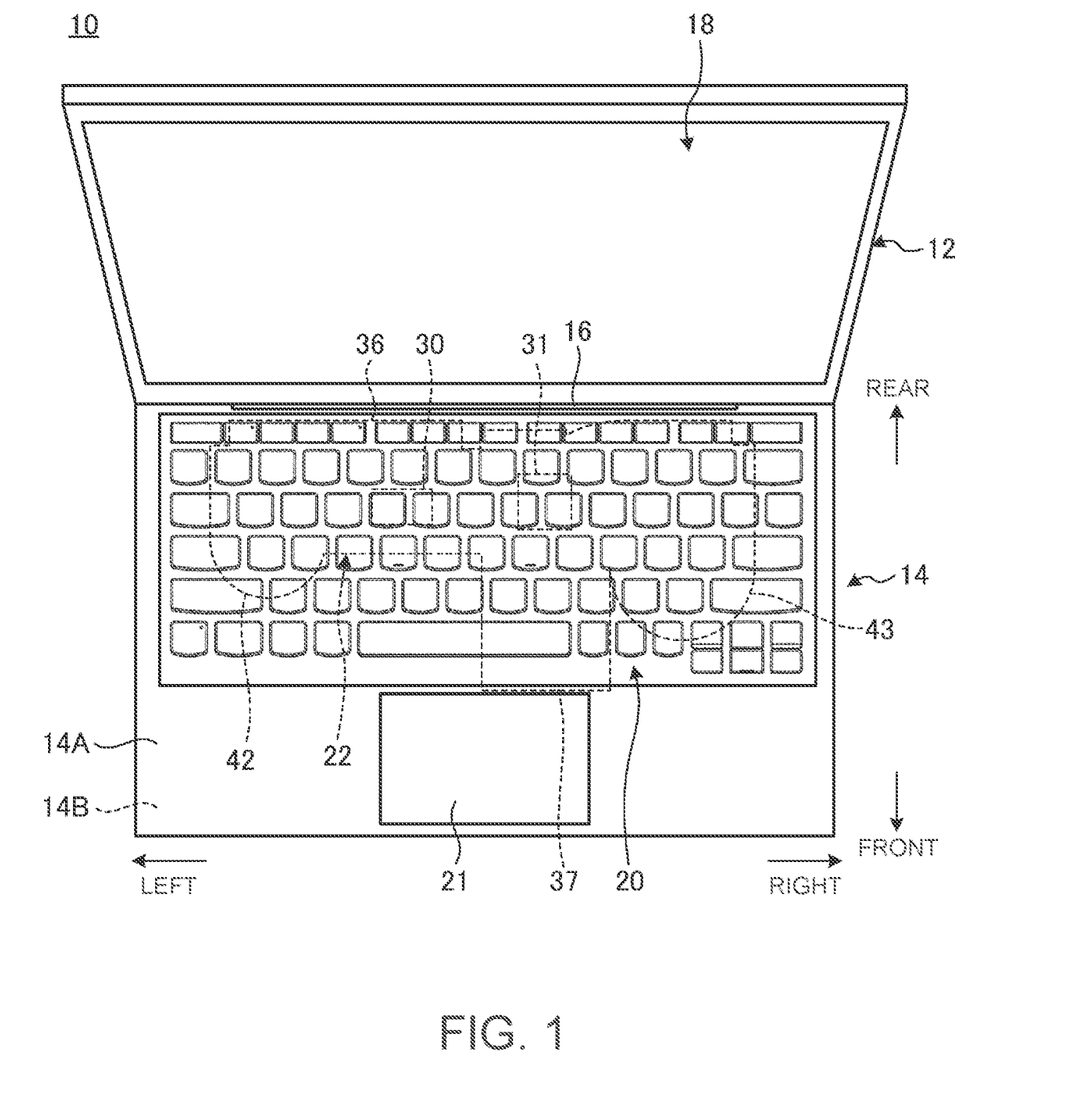
FIG. 1 is a schematic plan view of an electronic apparatus according to an embodiment observed from above.

FIG. 1 is a schematic plan view of an electronic apparatus 10 according to an embodiment observed from above. As illustrated in FIG. 1, the electronic apparatus 10 is a clamshell laptop PC that has a cover body 12 and a chassis 14, which are connected by a hinge 16 in a relatively rotatable manner. The electronic apparatus in accordance with the present invention may be, for example, a desktop PC, a tablet PC, or a game machine other than a laptop PC.

The cover body 12 is a thin, flat box. A display 18 is mounted in the cover body 12. The display 18 is, for example, an organic EL display or a liquid crystal display.

In the following description, regarding the chassis 14 and the elements mounted therein, the posture in which a keyboard 20 located on the upper surface of the chassis 14 is operated will be the reference posture, and a front relative to the reference posture will be referred to as the front, a back relative thereto will be referred to as the rear, a width direction will be referred to as left and right, and a height direction (the thickness direction of the chassis 14) will be referred to as top and bottom, as illustrated in FIG. 1.

The chassis 14 is a thin, flat box. The chassis 14 is composed of a cover member 14A that forms the upper surface and four peripheral side surfaces, and a cover member 14B that forms the lower surface. The upper cover member 14A has a substantially bathtub shape with an open bottom. The lower cover member 14B has a plate shape, and closes the bottom opening of the cover member 14A. The cover members 14A and 14B are overlapped in the thickness direction and are detachably connected to each other. The keyboard 20 and a touch pad 21 are provided on the upper surface of the chassis 14. The rear end portion of the chassis 14 is connected to the cover body 12 by using the hinge 16.

Figure 2:
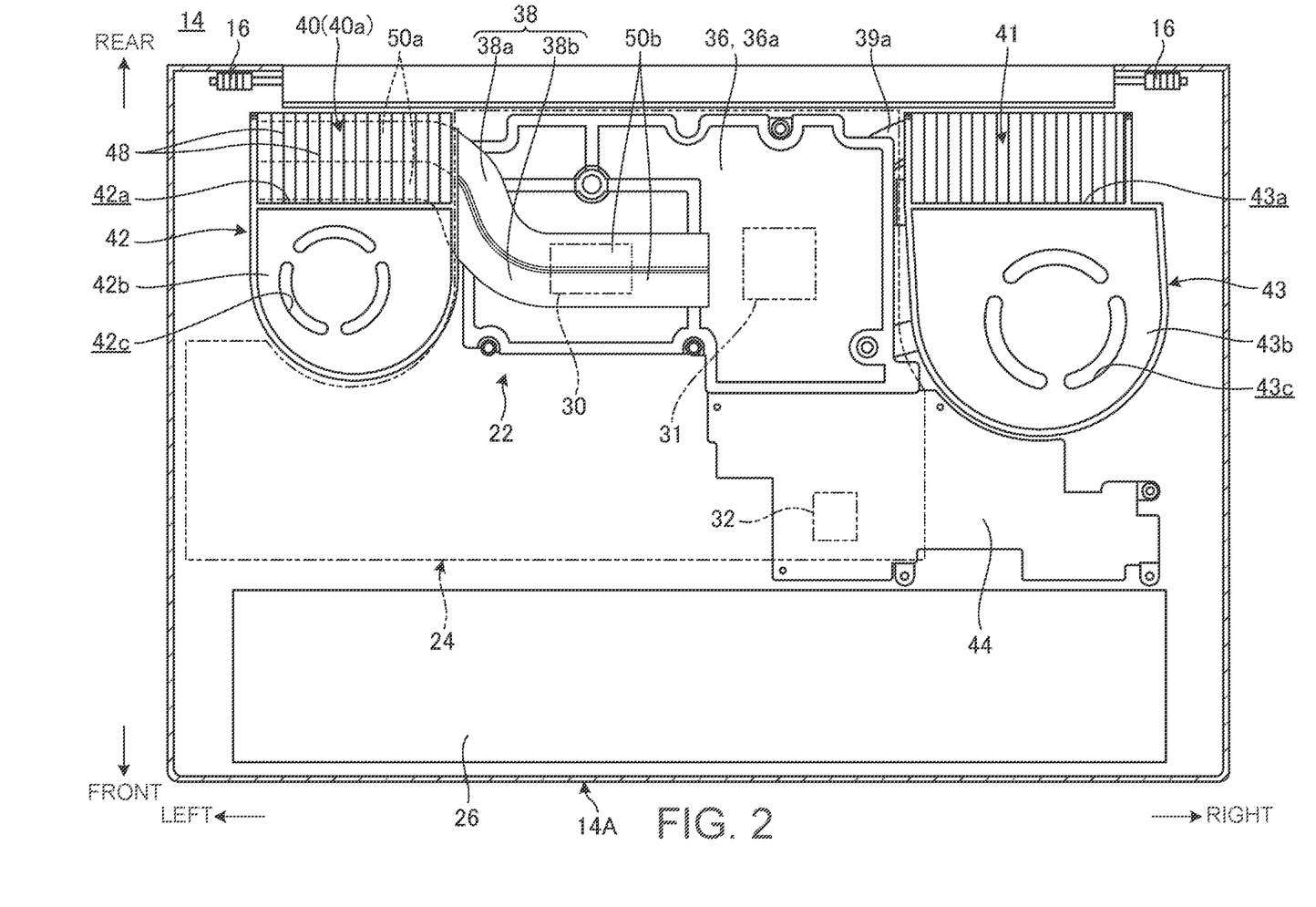
FIG. 2 is a plan view schematically illustrating the structure inside a chassis.

FIG. 2 is a plan view schematically illustrating the structure inside the chassis 14. FIG. 2 is a schematic plan sectional view illustrating the chassis 14 cut at a position slightly below the keyboard 20.

As illustrated in FIG. 2, a cooling module 22, a motherboard 24, and a battery unit 26 are provided inside the chassis 14. The chassis 14 further includes therein a variety of electronic components, mechanical components, and the like.

The motherboard 24 is a printed circuit board serving as the mainboard of the electronic apparatus 10. The motherboard 24 is placed adjacently to the back of the chassis 14 and extends along a left-right direction. Mounted on the motherboard 24 are a variety of electronic components such as a PCH (Platform Controller Hub) 32, a communication module, and memories, in addition to a CPU (Central Processing Unit) 30 and a GPU (Graphics Processing Unit) 31. The motherboard 24 is placed under the keyboard 20 and screwed to the rear surface of the keyboard 20 and the inner surface of the cover member 14A. The upper surface of the motherboard 24 serves as a surface of installation to the cover member 14A, and the lower surface thereof serves as a mounting surface 24a for the CPU 30 and the like (refer to FIG. 4).

The CPU 30 is placed slightly to the left relative to the center of the mounting surface 24a. The CPU 30 is a processing device that performs calculations for main control and processing of the electronic apparatus 10. A symbol 30a in FIG. 4 denotes a package substrate on which the CPU (die) 30 is mounted. The GPU 31 is placed slightly to the right relative to the center of the mounting surface 24a. The GPU 31 performs calculations required for drawing images such as 3D graphics. A symbol 31a in FIG. 4 denotes a package substrate on which the GPU (die) 31 is mounted. The PCH 32 controls a plurality of data paths and supports the function of the CPU 30.

The battery unit 26 is a rechargeable battery that serves as a power source for the electronic apparatus 10. The battery unit 26 is placed in front of the motherboard 24, and extends to the left and right along the front end portion of the chassis 14.

The configuration of the cooling module 22 will now be described.

The CPU 30 and the GPU 31 are heat generating elements that have the largest amount of heat generated among the electronic components mounted in the chassis 14. Therefore, the cooling module 22 absorbs and diffuses the heat generated by the CPU 30 and the GPU 31, and further discharges the heat to the outside of the chassis 14. The cooling module 22 is stacked under the mounting surfaces 24a of the motherboard 24. The cooling module 22 of the present embodiment can cool heat generating elements, such as the PCH 32, other than the CPU 30 and the GPU 31.

Figure 3:
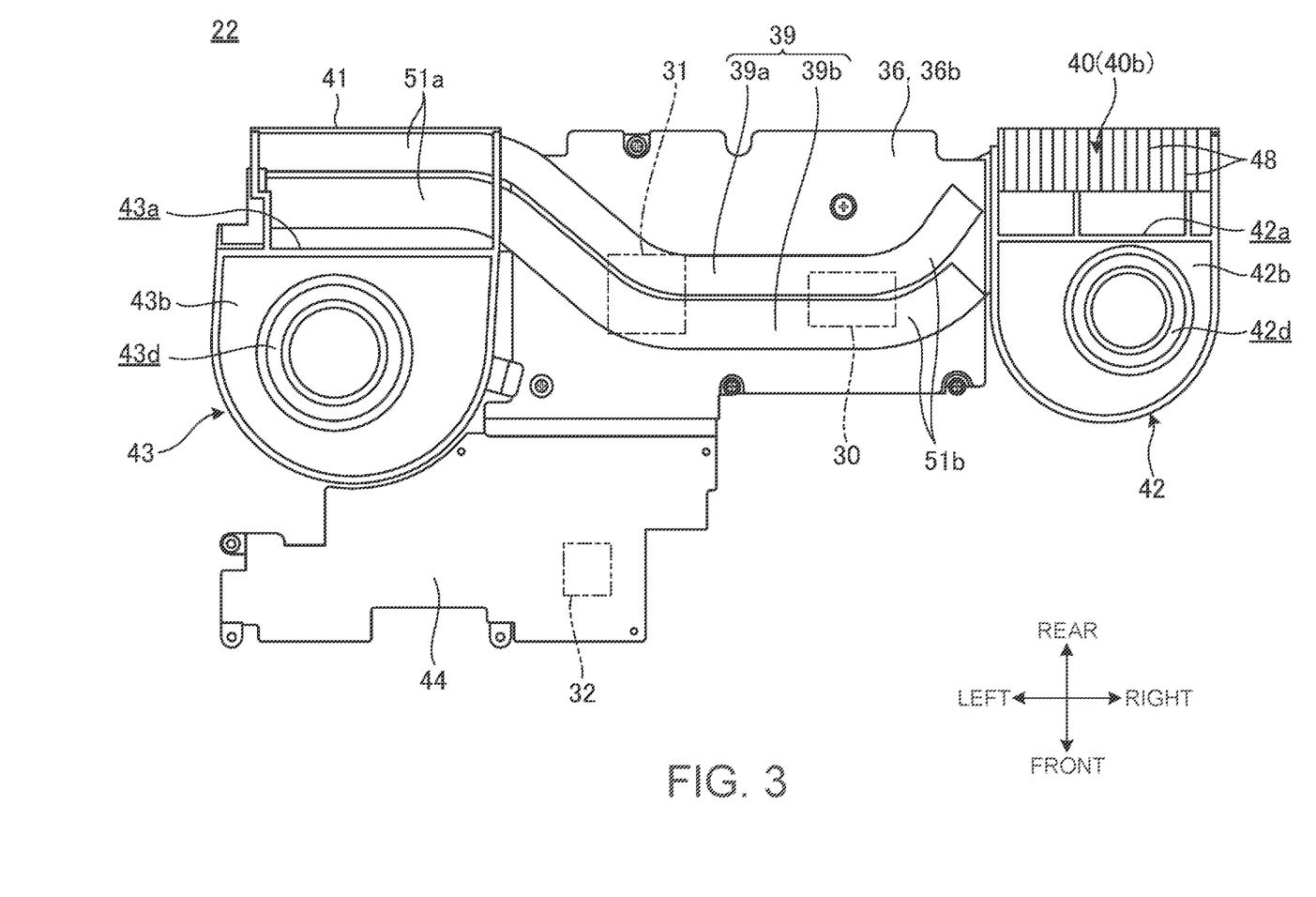
FIG. 3 is a schematic bottom view of a cooling module.
Figure 4:
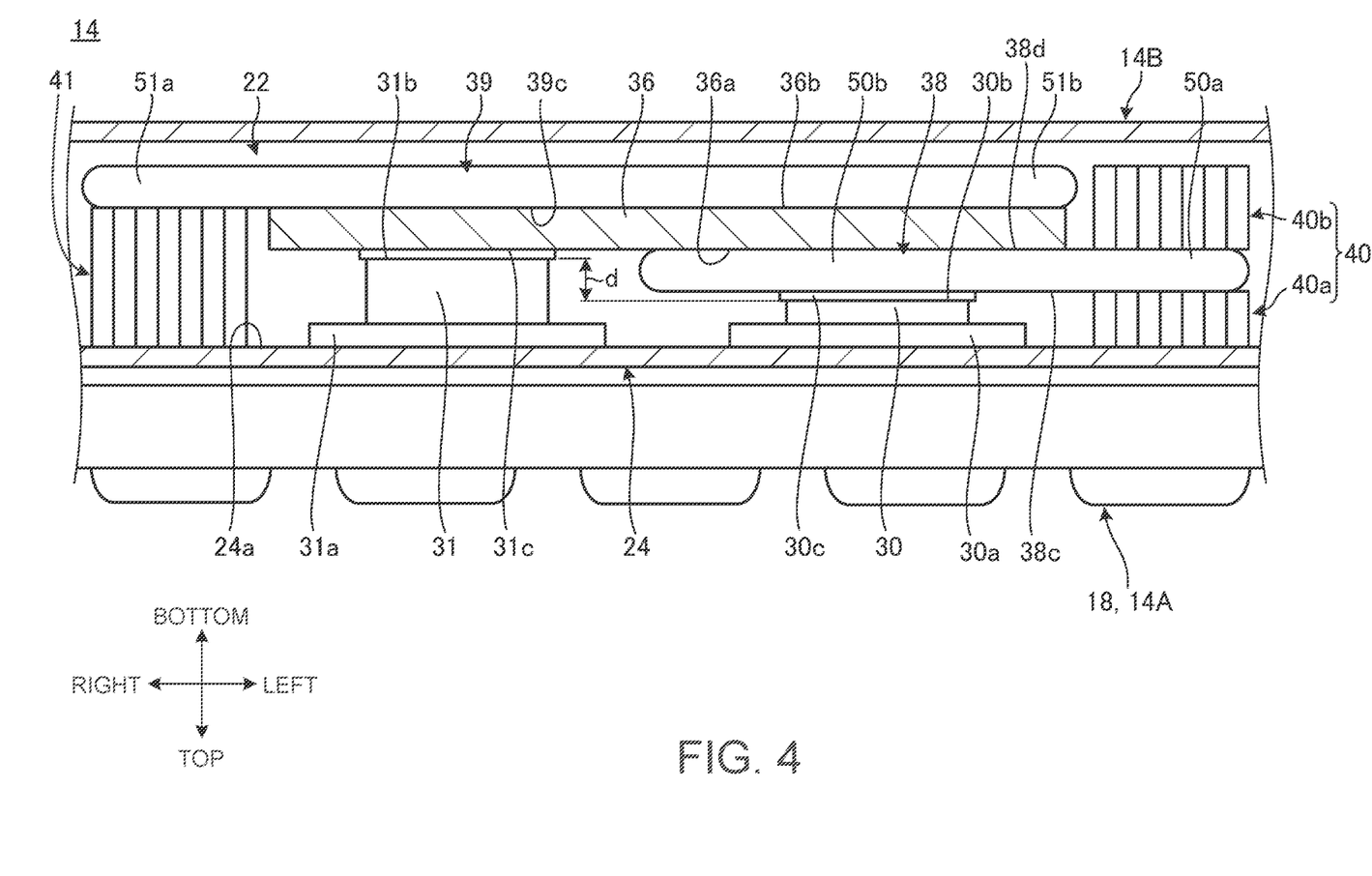
FIG. 4 is a side sectional view schematically illustrating the structure inside the chassis.

FIG. 3 is a schematic bottom view of the cooling module 22. FIG. 4 is a side sectional view schematically illustrating the structure inside the chassis 14, the cooling module 22 and the surrounding area thereof being illustrated in an enlarged view.

As illustrated in FIG. 2 to FIG. 4, the cooling module 22 includes a vapor chamber 36, a first heat pipe 38 composed of a set of two pipes, a second heat pipe 39 composed of a set of two pipes, a pair of left and right fins 40 and 41, a pair of left and right fans 42 and 43, and a thermally conductive plate 44.

The vapor chamber 36 is a plate-shaped heat transfer device. The vapor chamber 36 is formed of a hermetically sealed space between two thin metal plates. The vapor chamber 36 implements efficient heat transfer by a working fluid, which is sealed in the hermetically sealed space and flows while undergoing a phase change. The metal plates are formed of a metal having high thermal conductivity such as aluminum or copper. Examples of the working fluid include, for example, water, chlorofluorocarbon substitute, acetone, and butane. In the hermetically sealed space, a wick formed of a metal mesh or the like is provided, and a condensed working fluid is fed by capillary action.

The vapor chamber 36 is formed, for example, in a substantially rectangular plate shape having a large surface area, and covers the CPU 30 and GPU 31 between the fans 42 and 43. The vapor chamber 36 is thin and easily deformed. Therefore, the vapor chamber 36 is reinforced by joining a frame to the outer peripheral edge portion and a central portion of a first surface 36a, which is the upper surface (refer to FIG. 2). The frame is made of a metal such as stainless steel, and is composed of a rod that is thicker than the vapor chamber 36 and formed into a frame shape.

Figure 5:
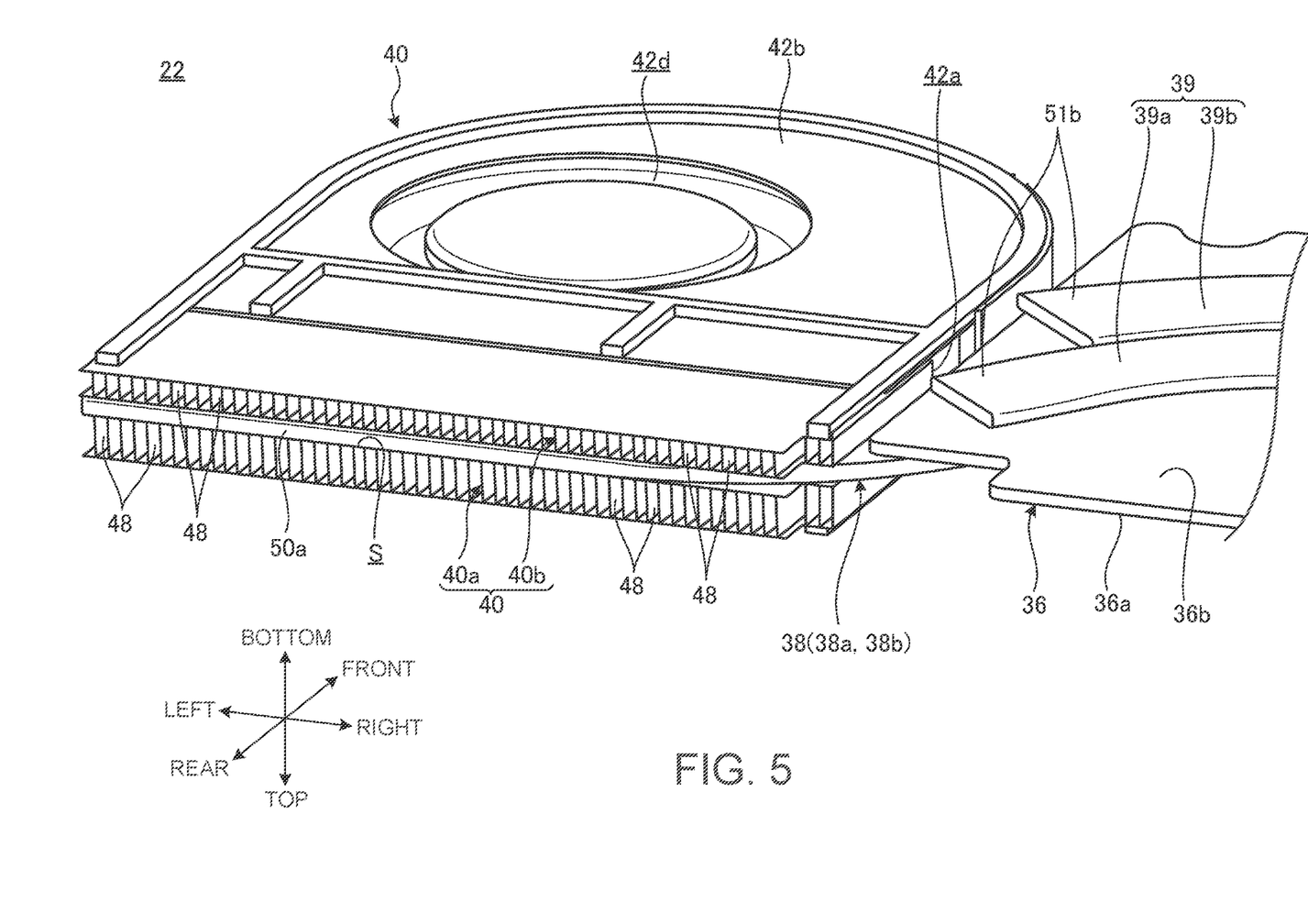
FIG. 5 is a perspective view illustrating the configurations of a left fin and the surrounding area thereof.

As illustrated in FIG. 3 to FIG. 5, the first heat pipe 38 is a pipe-shaped heat transfer device. In the present embodiment, the first heat pipe 38 is used in a set of two heat pipes 38a and 38b arranged in parallel at front and rear; however, one or three or more heat pipes may alternatively be used. The heat pipes 38a and 38b are formed by crushing metal pipes thinly and flatly to have elliptical cross sections, and hermetically sealed spaces are formed therein. The heat pipes 38a and 38b implement highly efficient heat transfer by a working fluid which is sealed in the hermetically sealed space and flows while undergoing a phase change. The metal pipes are made of a metal having high thermal conductivity such as aluminum or copper. Examples of the working fluid include water, chlorofluorocarbon substitute, acetone, and butane. In the hermetically sealed space, a wick formed of a metal mesh or the like is provided, and a condensed working fluid is fed by capillary phenomenon.

The second heat pipe 39 has the same basic configuration as that of the first heat pipe 38 described above, except that the length and the path are different. More specifically, the second heat pipe 39 has the wick provided in the hermetically sealed space in the metal pipe, which has been flatly crushed, and a working fluid sealed therein. In the present embodiment, the second heat pipe 39 is composed of the set of two heat pipes 39a and 39b, which are arranged in parallel at front and rear; however, one or three or more heat pipes may alternatively be used. In the second heat pipe 39, the material of the metal pipes, the type of the working fluid, the configuration of the wick, and the like may be the same as or similar to those of the first heat pipe 38 described above.

FIG. 5 is a perspective view illustrating the configurations of the left fin 40 and the surrounding area thereof.

As illustrated in FIG. 2 to FIG. 5, the left fin 40 has a two-stage structure that includes a first plate assembly 40a and a second plate assembly 40b. The second plate assembly 40b is stacked under the first plate assembly 40a with a space S provided therebetween.

The first plate assembly 40a has a structure in which a plurality of thin metal plates 48 are arranged at equal intervals in the left-right direction. Each of the metal plates 48 is erected in the vertical direction and extends in a front-back direction. A gap through which air sent from the fan 42 passes is formed between adjacent metal plates 48. The metal plates 48 are formed of a metal having high thermal conductivity, such as aluminum or copper.

As illustrated in FIG. 5, the second plate assembly 40b has the same basic structure as that of the first plate assembly 40a except that the vertical and the lateral heights are different. In other words, the second plate assembly 40b also has a structure in which a plurality of thin metal plates 48 are erected vertically and horizontally and arranged at equal intervals in the left-right direction.

End portions 50a of the heat pipes 38a and 38b constituting the first heat pipe 38 are inserted in the space S between the plate assemblies 40a and 40b. The height of the space S is substantially the same as the thickness of the end portions 50a. The end portions 50a and the plate assemblies 40a and 40b are joined by, for example, soldering. In other words, the plate assemblies 40a and 40b are integrated with the heat pipe 38 sandwiched therebetween. The plate assemblies 40a and 40b may alternatively be joined by, for example, directly joining the left and right ends thereof by soldering or the like.

As illustrated in FIG. 2 to FIG. 4, the right fin 41 has the same basic configuration as that of the left fin 40 except that the right fin 41 does not have the two-stage structure like the left fin 40. In other words, the fin 41 also has the structure in which a plurality of thin metal plates are erected vertically and horizontally and arranged at equal intervals in the left-right direction. Further, a gap through which air sent from the fan 42 passes is formed between adjacent metal plates.

As illustrated in FIG. 2, FIG. 3 and FIG. 5, the left fan 42 is placed immediately in front of the fin 40. The fin 40 is placed, facing an exhaust port 42a, which opens to the back of the fan 42. The fan 42 is a centrifugal fan that rotates an impeller, which is housed in a fan chassis 42b, by a motor. The fan 42 discharges air in the chassis 14 drawn in through air intake ports 42c and 42d, which are opened in the upper surface and the lower surface, respectively, of the fan chassis 42b, through the exhaust port 42a. The air blown through the exhaust port 42a passes through the fin 40 to promote heat dissipation.

The right fan 43 is slightly different in size and the like, but has a basic configuration that is bilaterally symmetrical with the left fan 42, so that a detailed description thereof will be omitted. In other words, the fan 43 also has a rearward-facing exhaust port 43a and intake ports 43c and 43d that are open in the upper and lower surfaces of the fan chassis 43b. Further, the fin 41 is placed, facing the exhaust port 43a of the fan 43.

As illustrated in FIG. 2 and FIG. 3, the thermally conductive plate 44 is connected to the front edge portion of the vapor chamber 36, and protrudes forward. The thermally conductive plate 44 is a thin plate made of a metal such as aluminum or copper, or a material having high thermal conductivity such as graphite. The thermally conductive plate 44 is provided over the PCH 32 to absorb the heat thereof and transfer the heat to the vapor chamber 36. The thermally conductive plate 44 may be omitted.

As illustrated in FIG. 4, in the cooling module 22, a first surface 38c, which is the upper surface of the first heat pipe 38, is stacked on and connected to a surface 30b of the CPU 30 through the intermediary of a heat receiving plate 30c. The first surface 38c and the surface 30b are joined to the heat receiving plate 30c by, for example, soldering.

Further, the first surface 36a, which is the upper surface of the vapor chamber 36, is stacked on and connected to a surface 31b of the GPU 31 through the intermediary of a heat receiving plate 31c. The first surface 36a of the vapor chamber 36 is stacked on and connected to also a second surface 38d, which is the lower surface of the first heat pipe 38. The first surface 36a and the surface 31b are joined to the heat receiving plate 31c by, for example, soldering. The first surface 36a and the second surface 38d are also joined by, for example, soldering.

An upper surface 39c of the second heat pipe 39 is stacked on and connected to a second surface 36b, which is the lower surface of the vapor chamber 36. The upper surface 39c and the second surface 36b are also joined by, for example, soldering.

The heat receiving plates 30c and 31c are thin plates formed of a metal having high thermal conductivity, such as copper or aluminum. One or both of the heat receiving plates 30c and 31c may be omitted. For example, when the heat receiving plate 30c is omitted, the first surface 38c of the first heat pipe 38 should be joined directly to the surface 30b of the CPU 30.

As illustrated in FIG. 2, the first heat pipe 38 extends in the left-right direction as a whole, the central portion thereof being cranked in the front-rear direction. In the first heat pipe 38, the end portions 50a, which serve as heat dissipating portions, are connected to the left fin 40, and end portions 50b on the opposite side, which serve as heat receiving portions, are connected to the surface 30b of the CPU 30.

As illustrated in FIG. 3, the second heat pipe 39 has a central portion curved forward and extends in the left-right direction as a whole. The second heat pipe 39 is connected to the second surface 36b of the vapor chamber 36 at a position where the substantially central portion of the second heat pipe 39 that serves as the heat receiving portion vertically overlaps the CPU 30 and the GPU 31. In the second heat pipe 39, end portions 51a serving as heat dissipating portions are connected to the right fin 41, and end portions 51b on the opposite side are connected to the second surface 36b of the vapor chamber 36 at a position before the left fin 40.

Meanwhile, as illustrated in FIG. 4, the CPU 30 and the GPU 31 have a step d between the surfaces 30b and 31b thereof. The step d means that the height positions of the surfaces 30b and 31b are different in the vertical direction in the chassis 14. The step d is, for example, 1.5 mm.

The step d results from, for example, the board thickness of the GPU 31 being thicker than the board thickness of the CPU 30. Even if the CPU 30 and the GPU 31 have the same board thickness, the step d may result from the difference in board thickness between package substrates 30a and 31a, or in the mounting heights with respect to the motherboard 24, or the like. The step d may be also due to, for example, the configuration in which the CPU 30 is directly mounted on the motherboard 24 and the GPU 31 is mounted on a sub-board stacked on the motherboard 24.

As illustrated in FIG. 4, in the present embodiment, the first heat pipe 38 and the heat receiving plate 30c are sandwiched between the first surface 36a of the vapor chamber 36 and the surface 30b of the CPU 30. Further, the heat receiving plate 31c is sandwiched between the first surface 36a of the vapor chamber 36 and the surface 31b of the GPU 31.

Here, the vapor chamber 36 must be used in a state as flat as possible. This is because the vapor chamber 36, which has an extremely thin plate thickness of, for example, 1 mm or less, may cause a blockage in the internal hermetically sealed space when subjected to bending or deformation, thus leading to deterioration of the heat transfer performance. The heat receiving plate 30c and the heat receiving plate 31c are to have the same plate thickness.

As a result, the step d illustrated in FIG. 4 is set to be the same or substantially the same as the height equivalent to the thickness of the first heat pipe 38. In other words, the electronic apparatus 10 of the present embodiment has the first heat pipe 38 sandwiched between the vapor chamber 36 and the CPU 30 by using the step d between the surfaces 30b and 31b of the CPU 30 and the GPU 31, respectively.

The plate thicknesses of the heat receiving plates 30c and 31c may be slightly different. In such a case, the thickness of the first heat pipe 38 should be increased or decreased according to the difference in plate thickness between the heat receiving plates 30c and 31c. Further, if one of the heat receiving plates 30c and 31c is omitted, then the thickness of the first heat pipe 38 should be increased or decreased by the plate thickness of the heat receiving plate 30c or 31c that has been omitted.

In the cooling module 22 configured as described above, the heat generated by the CPU 30 is efficiently absorbed by the first heat pipe 38, efficiently transported to the fin 40, and discharged to the outside of the chassis 14 by the air blown from the fan 42. Further, the heat transmitted from the CPU 30 to the first heat pipe 38 is transmitted also to the vapor chamber 36 and diffused. Meanwhile, the heat generated by the GPU 31 is absorbed and diffused by the vapor chamber 36, efficiently transferred to the fin 41 through the second heat pipe 39, and discharged to the outside of the chassis 14 by the air blown from the fan 43.

The CPU 30 and the GPU 31 do not operate at a maximum output at the same time, but are normally in an operating state in which the load on one is high and the load on the other is low. In particular, the CPU 30 may perform a turbo operation for maintaining a high output state, and in this case, more rapid cooling is required to increase the turbo operation time.

Therefore, the cooling module 22 according to the present embodiment uses the step d between the CPU 30 and the GPU 31 to interpose the first heat pipe 38 between the CPU 30 and the vapor chamber 36. Consequently, if, for example, the CPU 30 is performing the turbo operation, the heat from the CPU 30 is quickly absorbed by the first heat pipe 38 and dissipated by the fin 40, and at the same time, the heat is absorbed and diffused also by the vapor chamber 36. As a result, the electronic apparatus 10 can maintain the turbo operation of the CPU 30 for an extended period of time.

Figure 6:
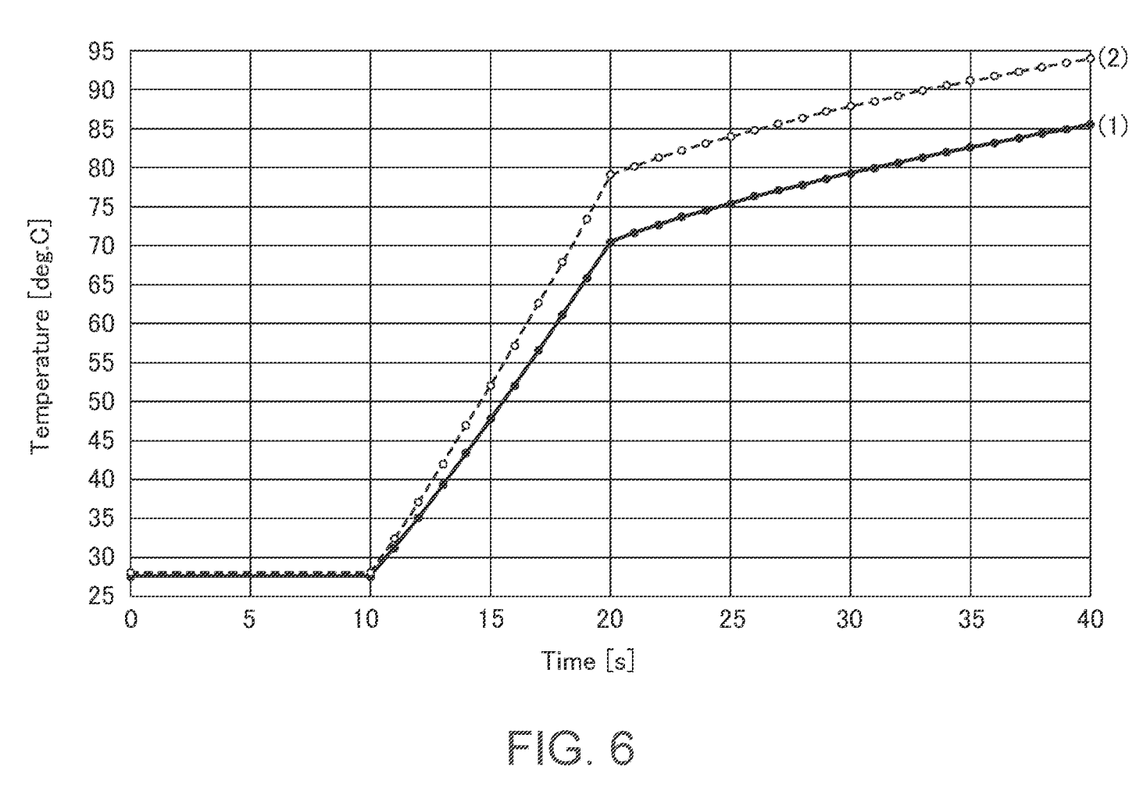
FIG. 6 is a graph illustrating the result of a simulation experiment comparing the cooling performance of the configuration of an example that has a first heat pipe and the configuration of a comparative example that omits the first heat pipe.

FIG. 6 is a graph illustrating the result of a simulation experiment comparing the cooling performance of the configuration of an example that has the first heat pipe 38 and the configuration of a comparative example that omits the first heat pipe 38.

In FIG. 6, the horizontal axis indicates the elapsed time (seconds), and the vertical axis indicates the surface temperature (° C.) of the CPU 30. Graph (1) indicated by a solid line and black dots in FIG. 6 illustrates the experiment result of the configuration according to an example having the first heat pipe 38. Graph (2) indicated by a dashed line and white dots in FIG. 6 illustrates the experiment result of the configuration according to a comparative example in which the first heat pipe 38 is not provided and the heat receiving plate 30c joined to the surface 30b of the CPU 30 is joined to the first surface 36a of the vapor chamber 36. In the configuration of the comparative example, the end portion 50b of the second heat pipe 39 is extended and connected to the fin 40. In this case, as with the fin 41, a general fin, which does not have a two-stage structure, was used for the fin 40. Further, in the configuration of the comparative example, the thickness of the heat receiving plate 30c is increased by a thickness equivalent to the step d.

The experiment was conducted with an idling operation for 10 seconds at first, and the total output of the CPU 30 and the GPU 31 set at 5.4 W, and then at 120 W assuming a turbo operation of the CPU 30.

As illustrated in FIG. 6, according to the configuration of the embodiment having the first heat pipe 38, it is seen that the temperature of the CPU 30 is always lower than that of the comparative example from the moment immediately after the turbo operation of the CPU 30 is started. Especially after 20 seconds elapse, a state is maintained, in which the temperature of the CPU 30 in the example is always lower by approximately 8° C. than that in the comparative example. Therefore, it has been found that the configuration of the example having the first heat pipe 38 has higher cooling performance for the CPU 30 than that of the configuration of the comparative example not having the first heat pipe 38, and significantly extends the turbo operation time. The specific experiment result indicates that the temperatures of the CPU 30 during the turbo operation were 85.6° C. in the comparative example and 84.4° C. in the example. The result shows that the configuration of the example provides higher cooling effect for the CPU 30 than the configuration of the comparative example.

As described above, the electronic apparatus 10 according to the present embodiment includes the CPU 30 and the GPU 31, which are the first and the second heat generating elements placed with the step d between the surfaces 30b and 31b thereof, and the cooling module 22 that absorbs the heat generated by the CPU 30 and the GPU 31. Further, the cooling module 22 has the first heat pipe 38 having the first surface 38c connected to the surface 30b of the CPU 30, the plate-shaped vapor chamber 36 having the first surface 36a connected to the surface 31b of the GPU 31 and the second surface 38d of the first heat pipe 38, and the second heat pipe 39 which is connected to the second surface 36b of the vapor chamber 36 and overlaps the GPU 31.

Further, the electronic apparatus 10 according to the present embodiment includes the CPU 30 and the GPU 31, which are the first and the second heat generating elements placed with the step d between the surfaces 30b and 31b thereof, and the cooling module 22 that absorbs the heat generated by the CPU 30 and the GPU 31. Further, the cooling module 22 has the first heat pipe 38 stacked on the surface 30b of the CPU 30, the heat receiving plate 31c stacked on the surface 31b of the GPU 31, and the plate-shaped vapor chamber 36 stacked on the surface of the heat receiving plate 31c and the second surface 38d of the first heat pipe 38.

Thus, the electronic apparatus 10 described above has the first heat pipe 38 provided between the vapor chamber 36 and the CPU 30 by using the step d between the CPU 30 and the GPU 31. This enables the electronic apparatus 10 to efficiently cool the CPU 30 and the GPU 31 by the two heat pipes 38, 39 and the fins 40, 41 connected to the heat pipes 38, 39, and the vapor chamber 36 stacked between the two heat pipes 38 and 39. Further, the electronic apparatus 10 is capable of absorbing the heat of the CPU 30 more quickly by the highly efficient heat-absorbing action of the first heat pipe 38, thus making it possible to extend the turbo operation time.

Especially in the configuration provided with the second heat pipe 39, the second heat pipe 39 should be vertically overlapped with not only the GPU 31 but the CPU 30 also. This allows the heat of the CPU 30 to be efficiently transferred to the fin 41 through the second heat pipe 39 and dissipated in the case where, for example, the load on the GPU 31 is low and the load on the CPU 30 is high. In the case where the load on the CPU 30 is low and the load on the GPU 31 is high, the heat of the GPU 31 is efficiently dissipated not only by the fin 41 but also by the vapor chamber 36 and the fin 40 through the first heat pipe 38.

In this case, the second heat pipe 39 is not connected to the fin 40 to which the first heat pipe 38 is connected. In other words, the first heat pipe 38 is connected to the fin 40, so that if the second heat pipe 39 were to be connected also to the fin 40, then the height of the fin 40 would have to be reduced due to the relationship with the thickness of the chassis 14. As a result, the surface area of the fin 40 would be smaller and the cooling efficiency thereof would be lowered.

In the fin 40, the end portions 50a of the first heat pipe 38 are inserted in the space S between the upper and the lower plate assemblies 40a and 40b. More specifically, as is obvious from FIG. 4, the height of the cooling module 22 is restricted by the thickness of the chassis 14, and the heights of the fins 40 and 41 are maximized within the restriction. Consequently, the first heat pipe 38 placed in the vicinity of the center in the vertical direction of the cooling module 22 would have to be bent in the vertical direction if the first heat pipe 38 were to be connected to the upper surface or the lower surface of the fin 40. This may cause blockage in the hermetically sealed space at the bent portion in the first heat pipe 38, thus lowering the heat transfer efficiency. In this respect, the electronic apparatus 10 has the first heat pipe 38 inserted in the space S at the middle of the fin 40, thus making it possible to solve the problem of efficiency degradation described above. In the case where efficiency degradation caused by bending is not a problem, the first heat pipe 38 can be of course bent and connected to the upper surface or the lower surface of the fin 40.

In the electronic apparatus 10, the first heat pipe 38 is not connected to the fin 41 to which the second heat pipe 39 is connected. This is the same as the case of the above-described structure in which the second heat pipe 39 is not connected to the fin 40. This is because if the first heat pipe 38, in addition to the second heat pipe 39, were to be connected to the fin 41, the height thereof would have to be reduced, leading rather to lower cooling efficiency.

Further, the electronic apparatus 10 according to the present embodiment includes the CPU 30, the GPU 31, and the cooling module 22 that absorbs the heat generated by the CPU 30 and the GPU 31. Further, the cooling module 22 has the first heat pipe 38 stacked on the surface 30b of the CPU 30, the plate-shaped vapor chamber 36 stacked on the surface 31b of the GPU 31 and the second surface 38d of the first heat pipe 38, and the second heat pipe 39 which is stacked on the second surface 36b of the vapor chamber 36 and overlaps the CPU 30 and the GPU 31 in the vertical direction.

Thus, the electronic apparatus 10 described above also has the first heat pipe 38 provided between the vapor chamber 36 and the CPU 30, and the second heat pipe 39 overlapping the CPU 30 and the GPU 31. Consequently, the electronic apparatus 10 can efficiently cool the CPU 30 and the GPU 31. In particular, the electronic apparatus 10 is capable of absorbing the heat of the CPU 30 more quickly by the highly efficient heat-absorbing action of the first heat pipe 38, thus making it possible to extend the turbo operation time. Further, in the case where the load on the GPU 31 is larger than the load on the CPU 30, the electronic apparatus 10 can transport the heat of the GPU 31 by distributing the heat to the two heat pipes 38 and 39 through the vapor chamber 36.

The present invention is not limited to the embodiments described above, and can of course be freely modified within a range not departing from the gist of the present invention.

The fans 42, 43 and the fins 40, 41 may alternatively be composed of only one each rather than the pair of left and right.

The invention claimed is:

1. An electronic apparatus comprising:
   a chassis;
   a first and a second heat generating elements in the chassis and with a step in height between the first and the second heat generating elements; and
   a cooling module in the chassis and that absorbs heat generated by the first and the second heat generating elements,
   wherein the cooling module has:
     a first heat pipe having a first surface connected to a surface of the first heat generating element;
     a plate-shaped vapor chamber having a first surface thereof connected to a surface of the second heat generating element and to a second surface of the first heat pipe;

a second heat pipe connected to a second surface of the vapor chamber and which overlaps the second heat generating element;
wherein the second heat pipe overlaps the first heat generating element;
a first fin connected to the first heat pipe; and
a second fin connected to the second heat pipe.

2. The electronic apparatus according to claim 1, wherein the second heat pipe is disconnected from the first fin.

3. An electronic apparatus comprising:
a chassis;
a first and a second heat generating elements in the chassis and with a step in height between the first and the second heat generating elements; and
a cooling module in the chassis and that absorbs heat generated by the first and the second heat generating elements,
wherein the cooling module has:
  a first heat pipe having a first surface connected to a surface of the first heat generating element;
  a plate-shaped vapor chamber having a first surface thereof connected to a surface of the second heat generating element and to a second surface of the first heat pipe;
  a second heat pipe connected to a second surface of the vapor chamber and which overlaps the second heat generating element;
  a first fin connected to the first heat pipe; and
  a second fin connected to the second heat pipe;
  a first fan which has an exhaust port facing the first fin; and
  a second fan which has an exhaust port facing the second fin,
the first fin has:
  a first plate assembly having a plurality of metal plates arranged with a gap provided therebetween; and
  a second plate assembly which has another plurality of metal plates arranged with another gap provided therebetween, and which is stacked with a space separating the second plate assembly from the first plate assembly, and
the first heat pipe has one end portion thereof inserted in the space, and is connected to the first plate assembly and the second plate assembly.

4. The electronic apparatus according to claim 3, wherein the first heat pipe is disconnected from the second fin.

\* \* \* \* \*